(12) United States Patent
Chung et al.

(10) Patent No.: US 11,088,135 B2
(45) Date of Patent: Aug. 10, 2021

(54) ELECTROSTATIC DISCHARGE PROTECTION APPARATUS AND INTEGRATED PASSIVE DEVICE WITH CAPACITORS

(71) Applicant: Industrial Technology Research Institute, Hsinchu (TW)

(72) Inventors: Yu-Hua Chung, Pingtung County (TW); Tai-Jui Wang, Kaohsiung (TW); Chieh-Wei Feng, Taoyuan (TW)

(73) Assignee: Industrial Technology Research Institute, Hsinchu (TW)

( * ) Notice: Subject to any disclaimer, the term of this patent is extended or adjusted under 35 U.S.C. 154(b) by 195 days.

(21) Appl. No.: 16/406,032

(22) Filed: May 8, 2019

(65) Prior Publication Data

US 2020/0212033 A1 Jul. 2, 2020

(30) Foreign Application Priority Data

Dec. 26, 2018 (TW) .................................. 107147215

(51) Int. Cl.
*H01L 27/02* (2006.01)
*H01L 23/60* (2006.01)
*H01L 23/522* (2006.01)

(52) U.S. Cl.
CPC ........ *H01L 27/0296* (2013.01); *H01L 23/522* (2013.01); *H01L 23/60* (2013.01)

(58) Field of Classification Search
CPC ... H01L 23/522; H01L 23/5286; H01L 23/60; H01L 23/5223; H01L 25/0655;
(Continued)

(56) References Cited

U.S. PATENT DOCUMENTS 6,919,602 B2 * 7/2005 Lin ..................... H01L 27/0266
257/355
8,873,209 B2 10/2014 Blanc et al.
(Continued)

FOREIGN PATENT DOCUMENTS

CN 101208789 6/2008
CN 204442303 7/2015
(Continued)

OTHER PUBLICATIONS

"Office Action of Taiwan Counterpart Application," dated Aug. 5, 2019, p. 1-p. 5.

*Primary Examiner* — Kevin J Comber
(74) *Attorney, Agent, or Firm* — JCIPRNET

(57) ABSTRACT

An electrostatic discharge (ESD) protection apparatus and an integrated passive device (IPD) with capacitor(s) are provided. The ESD protection apparatus includes a transistor, an impedance, and a capacitor disposed in a redistribution layer (RDL) structure of a package. The first terminal and the second terminal of the transistor are respectively coupled to a first power rail and a second power rail of the RDL structure. A first terminal of the impedance is coupled to the first power rail. A second terminal of the impedance is coupled to a control terminal of the transistor. A first terminal of the capacitor is coupled to the second terminal of the impedance. A second terminal of the capacitor is coupled to the second power rail.

14 Claims, 15 Drawing Sheets

(58) Field of Classification Search
CPC ............. H01L 27/0285; H01L 27/0288; H01L 27/0296; H01L 2224/16227
USPC .......................................................... 361/56
See application file for complete search history.

(56) References Cited

U.S. PATENT DOCUMENTS

| | | | |
|---|---|---|---|
| 2007/0138558 A1* | 6/2007 | Saitoh ................. | H01L 29/4238 257/350 |
| 2012/0248569 A1* | 10/2012 | Jenkins ................... | H01L 23/60 257/531 |
| 2013/0063843 A1 | 3/2013 | Chen et al. | |
| 2014/0268448 A1* | 9/2014 | Tseng ................. | H01L 25/0652 361/56 |
| 2015/0048497 A1 | 2/2015 | Henderson et al. | |
| 2016/0093606 A1 | 3/2016 | Chen et al. | |
| 2017/0154943 A1* | 6/2017 | Yang ................... | H01L 27/3276 |
| 2020/0043873 A1* | 2/2020 | Chang .................... | G06F 30/36 |

FOREIGN PATENT DOCUMENTS

| | | |
|---|---|---|
| CN | 106229314 | 12/2016 |
| TW | 201042747 | 12/2010 |
| TW | 201801245 | 1/2018 |

\* cited by examiner

ELECTROSTATIC DISCHARGE PROTECTION APPARATUS AND INTEGRATED PASSIVE DEVICE WITH CAPACITORS

CROSS-REFERENCE TO RELATED APPLICATION

This application claims the priority benefit of Taiwan application serial no. 107147215, filed on Dec. 26, 2018. The entirety of the above-mentioned patent application is hereby incorporated by reference herein.

BACKGROUND

Technical Field

The disclosure relates to a package of an integrated circuit, and also relates to an electrostatic discharge (ESD) protection apparatus and an integrated passive device with capacitors.

Description of Related Art

A fan-out package has been regarded as a cost-effective and highly integrated IC packaging technology for the next generation. According to some researches, an electrostatic discharge (ESD) with a charged-device model (CDM) is easily derived from a multi-chip package (MCP). An ESD current usually damages a chip (an integrated circuit). The common ESD protection circuit is disposed in the chip (the integrated circuit). The common ESD protection circuit disposed in the chip increases a layout area of the chip, which lowers production efficiency.

An ESD protection apparatus may be disposed in a silicon interposer. To reduce production costs (to reduce the number of photomasks), the ESD protection circuit disposed in the silicon interposer may use a passive component such as a diode, and the like, as an ESD protection components.

SUMMARY

In an embodiment of the disclosure, an ESD protection apparatus is provided. The ESD protection apparatus includes a first transistor, an impedance, and a capacitor. The first transistor is disposed in a redistribution layer (RDL) structure of a package. A first terminal and a second terminal of the first transistor are respectively coupled to a first power rail and a second power rail of the RDL structure. At least one integrated circuit is accommodated in the package. A first power pad and a second power pad of the integrated circuit are respectively coupled to the first power rail and the second power rail of the RDL structure. The impedance is disposed in the RDL structure. A first terminal of the impedance is coupled to the first power rail. A second terminal of the impedance is coupled to a control terminal of the first transistor. The capacitor is disposed in the RDL structure. A first terminal of the capacitor is coupled to the second terminal of the impedance. A second terminal of the capacitor is coupled to the second power rail.

In an embodiment of the disclosure, an integrated passive device (IPD) with the capacitors is provided. The IPD includes a first capacitor and a second capacitor. The first capacitor is disposed in a RDL structure of a package. At least one integrated circuit is accommodated in the package. At least one pad of the integrated circuit is respectively coupled to at least one pin of the package through the RDL structure. The second capacitor is disposed in the RDL structure. A first terminal of the second capacitor is coupled to a first terminal of the first capacitor. A second terminal of the second capacitor is coupled to a second terminal of the first capacitor. A conductive component of the RDL structure is applied as an electrode plate of the second capacitor. In a vertical projection of the RDL structure, the conductive component completely overlaps or partially overlaps the first capacitor.

In an embodiment of the disclosure, an ESD protection apparatus is provided. The ESD protection apparatus includes a first transistor, a second transistor, an impedance and a capacitor. A first terminal and a second terminal of the first transistor are respectively coupled to a first power rail and a second power rail. A first terminal of the impedance is coupled to the first power rail. A second terminal of the impedance is coupled to a control terminal of the first transistor. A first terminal of the capacitor is coupled to the second terminal of the impedance. A second terminal of the capacitor is coupled to the second power rail. A control terminal of the second transistor is coupled to the second terminal of the impedance and the first terminal of the capacitor. A first terminal of the second transistor is coupled to a signal pin of a package. A second terminal of the second transistor is coupled to the first power rail or the second power rail.

In order to make the disclosure more comprehensible, embodiments accompanied with FIGS. are described in detail below.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
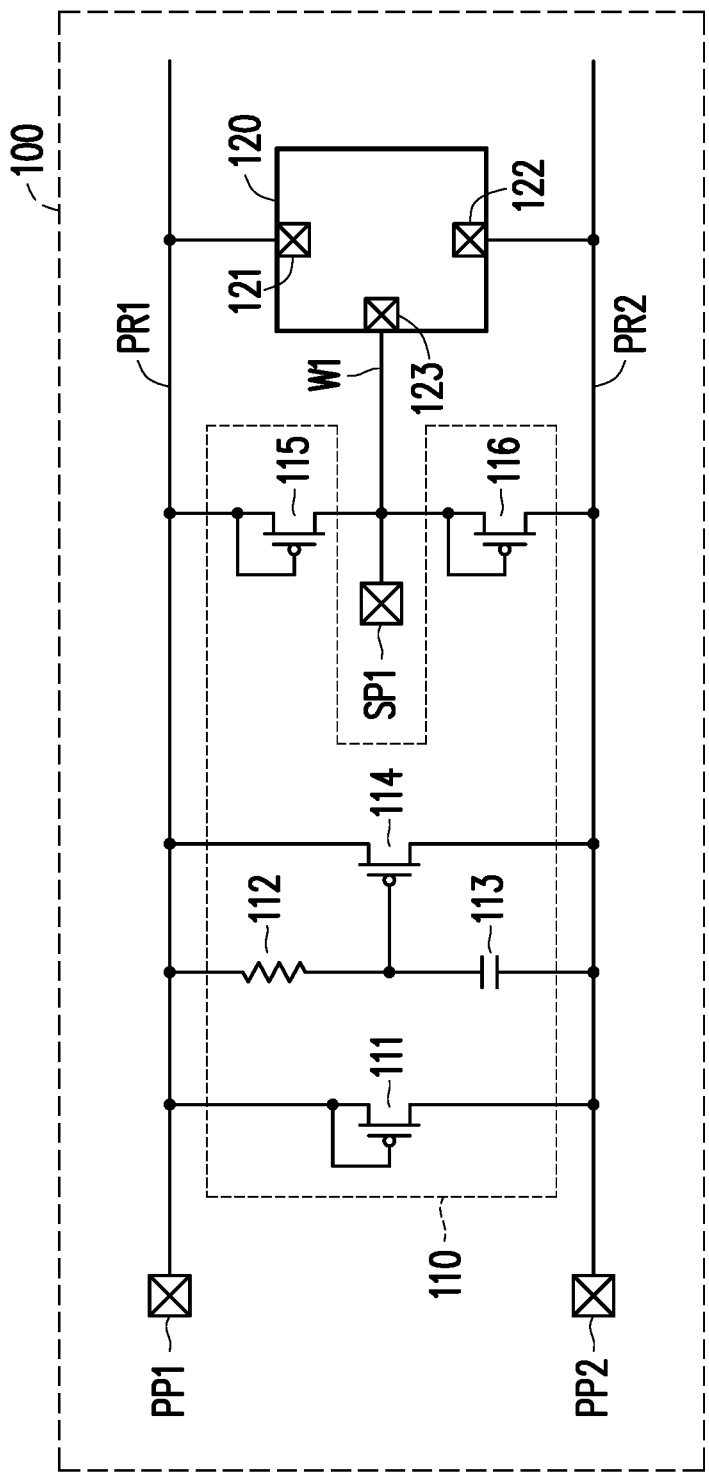
FIG. 1 is a circuit block diagram of an electrostatic discharge (ESD) protection apparatus disposed in a package according to an embodiment of the disclosure.

The term "couple (or connect)" used throughout this specification (including the claims) may refer to any direct or indirect connection means. For example, if it is described that the first device is coupled (or connected) to the second device, it should be understood that the first device may be directly connected to the second device or indirectly connected to the second device through other devices or certain connection means. Moreover, elements/components/steps with the same reference numerals represent the same or similar parts in the figures and embodiments where appropriate. Descriptions of the elements/components/steps with the same reference numerals or terms in different embodiments may be reference for one another.

In the embodiments of the disclosure, the ESD protection apparatus and the IPD with the capacitor may be realized in the RDL structure of the package to provide an ESD protection. In some embodiments, the capacitor of the ESD protection apparatus includes a first capacitor and a second capacitor in the RDL structure of the package. One conductive component of the RDL structure is an electrode plate of the second capacitor. In the vertical projection of the RDL structure, the conductive component completely overlaps or partially overlaps the first capacitor to reduce the layout area of the capacitor.

FIG. 1 is a circuit block diagram of an electrostatic discharge (ESD) protection apparatus disposed in a package according to an embodiment of the disclosure. A package 100 has a redistribution layer (RDL) structure and a plurality of pins. An example of the RDL structure of the package 100 of the embodiment is not limited thereto. For example, based on design requirements, the RDL structure of the package 100 may include conventional RDL structures and/or other RDL structures.

The package 100 may accommodate one or a plurality of integrated circuits (or also known as a chip, for example, an integrated circuit 120 as illustrated in FIG. 1). The RDL structure and the integrated circuit 120 are disposed in the package 100, where the RDL structure is external to the integrated circuit 120.

The integrated circuit 120 may be electrically coupled to one or a plurality of pins through the RDL structure of the package 100. For example, a signal pad 123 of the integrated circuit 120 is coupled to a signal pin SP1 of the package 100 through a signal wire W1 of the RDL structure of the package 100. For another example, a first power pad 121 of the integrated circuit 120 may be coupled to a first power rail PR1 of the RDL structure of the package 100, and the second power pad 122 of the integrated circuit 120 may be coupled to a second power rail PR2 of the RDL structure of the package 100. Therefore, the integrated circuit 120 may be electrically coupled to a first power pin PP1 through the first power rail PR1 of the RDL structure, and the integrated circuit 120 may be electrically coupled to the second power pin PP2 through the second power rail PR2 of the RDL structure. Based on design requirements, when the first power rail PR1 is a system voltage rail, the second power rail PR2 may be a reference voltage rail (for example, a ground voltage rail). When the first power rail PR1 is the reference voltage rail, the second power rail PR2 may be the system voltage rail.

The ESD protection apparatus 110 is disposed in the RDL structure of the package 100. That is, the ESD protection apparatus 110 is external to the integrated circuit 120. The ESD protection apparatus 110 includes a transistor 111, an impedance 112, a capacitor 113, a transistor 114, a transistor 115, and a transistor 116. The transistor 111, the impedance 112, the capacitor 113, the transistor 114, the transistor 115 and the transistor 116 are all disposed in the RDL structure of the package 100. Based on design requirements, the transistor 111, the transistor 114, the transistor 115, and/or the transistor 116 may be a plurality of thin film transistors (TFTs) or an array of thin film transistors. For easier illustration, a thin film transistor is illustrated in both of drawings and the content. Furthermore, a semiconductor layer material of the thin film transistor may be polysilicon, metal oxide, such as indium gallium zinc oxide (IGZO), microcrystalline silicon or other types of semiconductor materials. For example, the transistor 111, the transistor 114, the transistor 115, and/or the transistor 116 may be a P-type low temperature polysilicon thin film transistor (LTPS-TFT).

A first terminal (for example, a source) and a control terminal (for example, a gate) of the transistor 111 are coupled to the first power rail PR1 (for example, a system voltage rail). A second terminal (for example, a drain) of the transistor 111 is coupled to the second power rail PR2 (for example, a ground voltage rail). Therefore, the transistor 111 may be functioned as a diode, where the first terminal of the transistor 111 is equivalent to a cathode of the diode, while the second terminal of the transistor 111 is equivalent to an anode of the diode. The transistor 111 illustrated in FIG. 1 is illustrated as a p-channel metal-oxide-semiconductor (PMOS) transistor. However, in other embodiments, the transistor 111 illustrated in FIG. 1 may be an n-channel metal-oxide-semiconductor (NMOS) transistor, or other transistors. Under the condition that the transistor 111 is realized by the NMOS transistor, the first terminal (for example, a source) of the transistor 111 and the control terminal (for example, a gate) of the transistor 111 are coupled to the second power rail PR2 (for example, a ground voltage rail). In addition, the second terminal (for example, a drain) of the transistor 111 is coupled to the first power rail PR1 (for example, a system voltage rail). In some embodiments, the transistor 111 may be omitted based on design requirements.

A first terminal of the impedance 112 is coupled to the first power rail PR1 of the RDL structure. A first terminal of the capacitor 113 is coupled to a second terminal of the impedance 112. A second terminal of the capacitor 113 is coupled to the second power rail PR2 of the RDL structure. A control terminal (for example, a gate) of the transistor 114 is coupled to the second terminal of the impedance 112 and the first terminal of the capacitor 113. A first terminal (for example, a source) of the transistor 114 is coupled to the first power rail PR1 (for example, a system voltage rail) of the RDL structure. A second terminal (for example, a drain) of the transistor 114 is coupled to the second power rail PR2 (for example, a ground voltage rail) of the RDL structure. The transistor 114 illustrated in FIG. 1 is illustrated as a PMOS transistor. In other embodiments, however, the transistor 114 illustrated in FIG. 1 may be an NMOS transistor or other transistors. Under the condition that the transistor 114 is realized as the NMOS transistor, the first terminal (for example, a drain) of the transistor 114 is coupled to the first power rail PR1 of the RDL structure, and the second terminal (for example, a source) of the transistor 114 is coupled to the second power rail PR2 of the RDL structure.

A first terminal (for example, a source) and a control terminal (for example, a gate) of the transistor 115 are coupled to the first power rail PR1 (for example, a system voltage rail). A second terminal (for example, a drain) of the translator 115 is coupled to the signal pin SP1 of the package 100. Therefore, the transistor 115 may be functioned as a diode, where the first terminal and the control terminal of the transistor 115 are equivalent to cathodes of the diode, and the second terminal of the transistor 115 is equivalent to the anode of the diode. The transistor 115 illustrated in FIG. 1 is illustrated as a PMOS transistor. In other embodiments, however, the transistor 115 illustrated in FIG. 1 may be an NMOS transistor or other transistors. Under the condition that the transistor 115 is realized by the NMOS transistor, the first terminal (for example, a source) and the control terminal (for example, a gate) of the transistor 115 are coupled to the second power rail PR2 (for example, a ground voltage rail). In addition, the second terminal (for example, a drain) of the transistor 115 is coupled to the first power rail PR1 (for example, a system voltage rail). In some embodiments, the transistor 115 may be omitted based on design requirements.

A first terminal (for example, a source) and a control terminal (for example, a gate) of the transistor 116 are coupled to the signal pin SP1. A second terminal (for example, a drain) of the transistor 116 is coupled to the second power rail PR2 (for example, a ground voltage rail). The exemplary details of the transistor 116 may be inferred with reference to the descriptions of the transistor 115, and thus shall not be repeatedly described here.

The ESD protection apparatus 110 illustrated in FIG. 1 may be integrated into the RDL structure of the package 100. Therefore, the ESD protection apparatus 110 is applicable to any panel manufacturing process, for example, a fan-out panel level packaging (FOPLP) manufacturing process.

Figure 2:
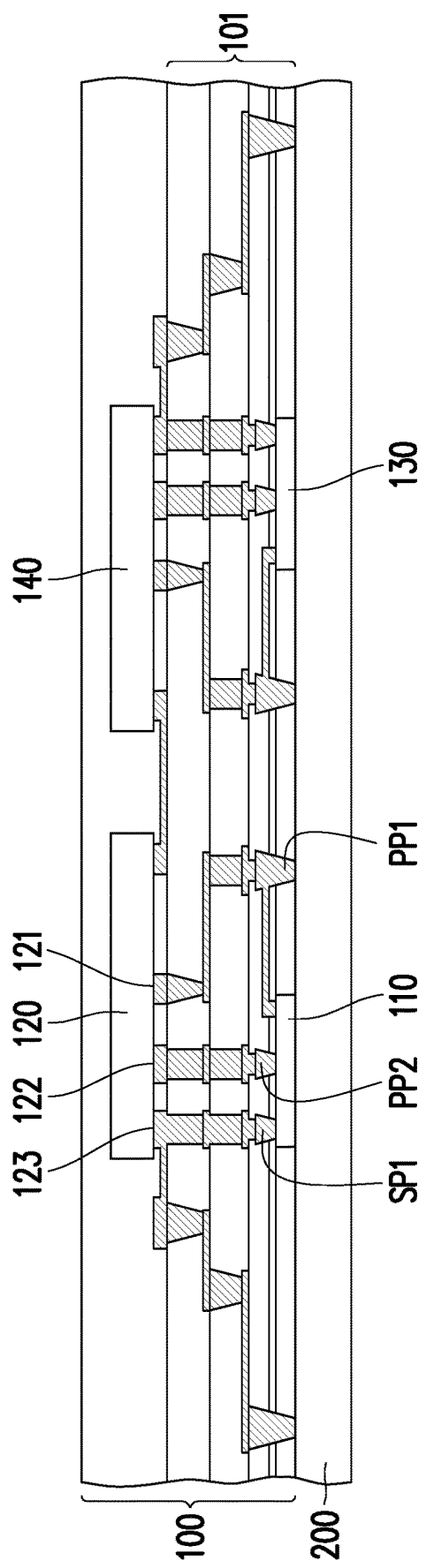
FIG. 2 is a cross-sectional schematic view of a layout structure of a package according to an embodiment of the disclosure.

FIG. 2 is a schematic cross-sectional view of a layout structure of a package according to an embodiment of the disclosure. A plurality of pins (for example, a first power pin PP1 illustrated in FIG. 2) of the package 100 are electrically coupled to different pads (not illustrated) of a substrate 200. Based on design requirements, the substrate 200 may be a glass substrate of a display panel, a printed circuit board, or other circuit substrates. The package 100 includes a RDL structure 101. The top of the RDL structure 101 is covered with a package material (non-conductive material) to protect the RDL structure 101, the integrated circuit 120, and the integrated circuit 140. The descriptions of the package 100, the RDL structure 101, the ESD protection apparatus 110, the integrated circuit 120, the signal pin SP1, the first power pin PP1, and the second power pin PP2 illustrated in FIG. 2 may be inferred with reference to the related descriptions of the package 100, the RDL structure 101, the ESD protection apparatus 110, the integrated circuit 120, the signal pin SP1, the first power pin PP1, and the second power pin PP2 illustrated in the embodiment of FIG. 1.

In the embodiment illustrated in FIG. 2, the package 100 accommodates the integrated circuit 120 and the integrated circuit 140. Descriptions of the integrated circuit 140 may be inferred with reference to the related descriptions of the integrated circuit 120. The integrated circuit 120 and the integrated circuit 140 may be electrically coupled to one or the plurality of pins of the package 100 by the RDL structure 101 of the package 100. For example, the signal pad 123 of the integrated circuit 120 may be electrically coupled to the signal pin SP1 through the signal wire of the RDL structure 101 of the package 100. For another example, the first power pad 121 of the integrated circuit 120 may be electrically coupled to the first power pin PP1 through the first power rail of the RDL structure 101. The second power pad 122 of the integrated circuit 120 may be electrically coupled to the second power pin PP2 through the second power rail of the RDL structure 101.

The ESD protection apparatus 110 and the ESD protection apparatus 130 are disposed in the RDL structure 101 of the package 100. That is, the ESD protection apparatus 110 and the ESD protection apparatus 130 are disposed external to the integrated circuit 120 and the integrated circuit 140. Descriptions of the ESD protection apparatus 130 may be inferred with reference to the related descriptions of the ESD protection apparatus 110.

Figure 3:
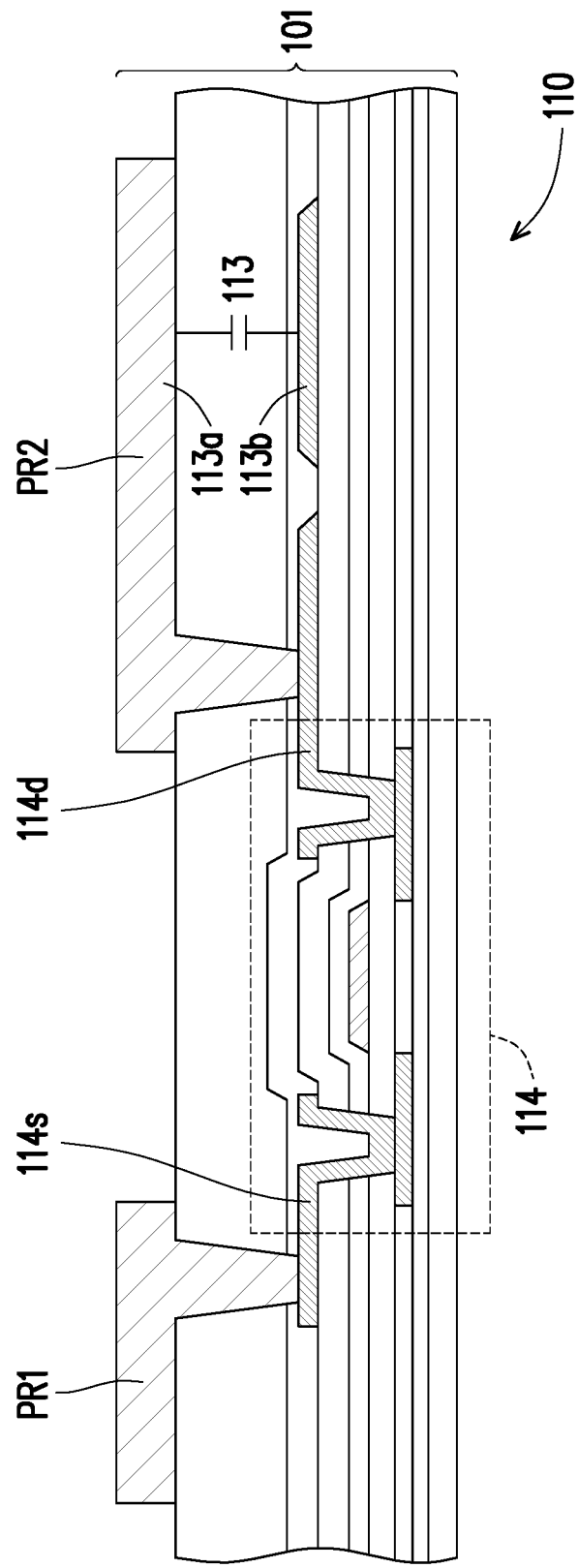
FIG. 3 is a cross-sectional schematic view of a layout structure of an ESD protection apparatus according to an embodiment of the disclosure.

FIG. 3 is a schematic view of a layout structure of an ESD protection apparatus according to an embodiment of the disclosure. Please refer to FIG. 1 and FIG. 3. Both the capacitor 113 and the transistor 114 are disposed in the RDL structure 101 of the package 100. A source electrode 114s and a drain electrode 114d of the transistor 114 are disposed in a second metal layer (generally known as a M2 layer) of the RDL structure 101. The source electrode 114s is electrically coupled to the first power rail PR1 (for example, a system voltage rail) through the via plug. A drain electrode 114d is electrically coupled to the second power rail PR2 (for example, a ground voltage rail) through the via plug. The first power rail PR1 and the second power rail PR2 are disposed in a metal electroplating layer of the RDL structure 101. A material of the metal electroplating layer may be determined according to design requirements. For example, the metal electroplating layer may be made of copper, gold or aluminum, etc. As the size of the substrate increases, taking a copper electroplating layer as an example, in order to improve the film-forming uniformity of the copper electroplating layer, a dummy copper may be simultaneously disposed to reduce the electric field difference applied to the substrate by the electroplating apparatus. In one embodiment, a dummy copper of the copper electroplating layer may be applied as the first power rail PR1 and/or the second power rail PR2 to reduce the layout area of the ESD protection apparatus.

In the embodiment illustrated in FIG. 3, a portion of the second power rail PR2 is applied as an electrode plate 113a for the capacitor 113. The other electrode plate 113b of the capacitor 113 is disposed in the second metal layer of the RDL structure 101. The electrode plate 113b is stacked under the electrode plate 113a to form the capacitor 113. The electrode plate 113b of the capacitor 113 may be electrically connected to a gate of the transistor 114.

Figure 4:
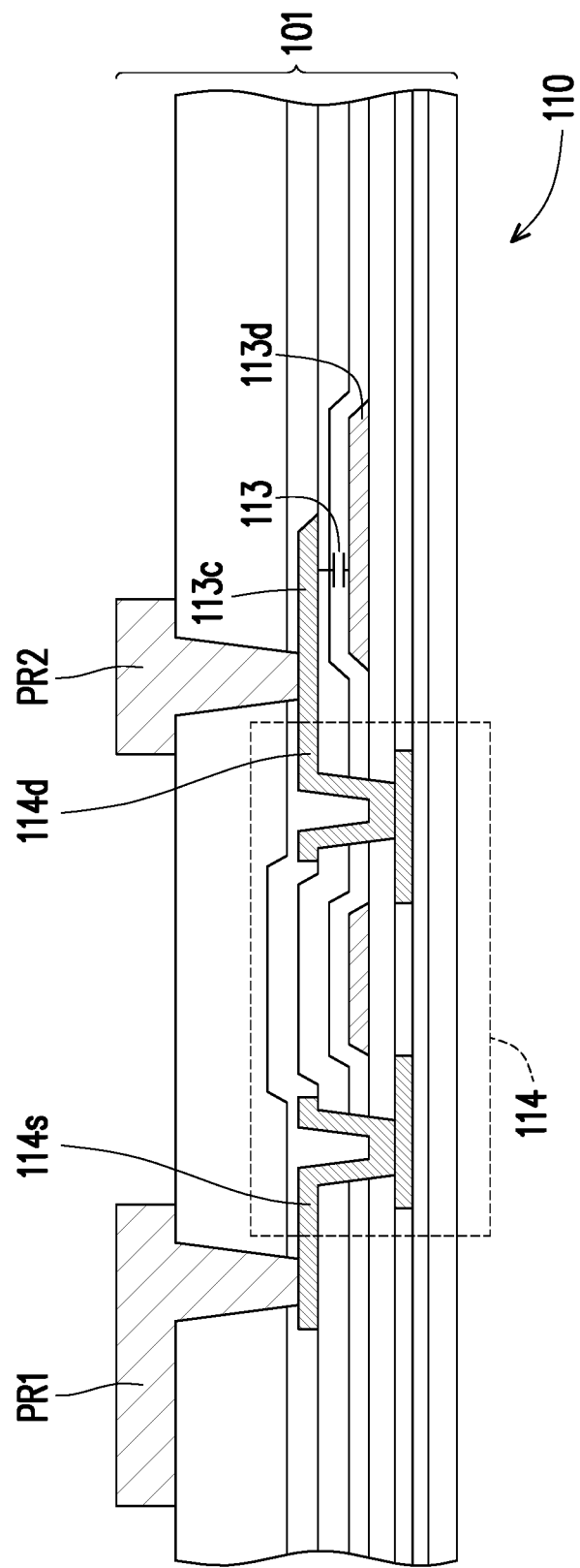
FIG. 4 is a cross-sectional schematic view of a layout structure of an ESD protection apparatus according to another embodiment of the disclosure.

FIG. 4 is a cross-sectional schematic view of a layout structure of an ESD protection apparatus according to another embodiment of the disclosure. Descriptions of the RDL structure 101, the ESD protection apparatus 110, the transistor 114, the source electrode 114s, the drain electrode 114d, the first power rail PR1, and the second power rail PR2 illustrated in FIG. 4 may be inferred with reference to the related descriptions of the RDL structure 101, the ESD protection apparatus 110, the transistor 114, the source electrode 114s, the drain electrode 114d, the first power rail PR1, and the second power rail PR2 illustrated in FIG. 3, and shall not be repeatedly described here.

Please refer to FIG. 1 and FIG. 4. In the embodiment illustrated in FIG. 4, an electrode plate 113c of the capacitor 113 is disposed in the second metal layer of the RDL structure 101. The electrode plate 113c is electrically connected to the drain electrode 114d of the transistor 114. The other electrode plate 113d of the capacitor 113 is disposed in a first metal layer (generally known as a M1 layer) of the RDL structure 101. The electrode plate 113d is stacked under the electrode plate 113c to form the capacitor 113. The electrode plate 113d of the capacitor 113 may be electrically connected to the gate of the transistor 114.

Figure 5:
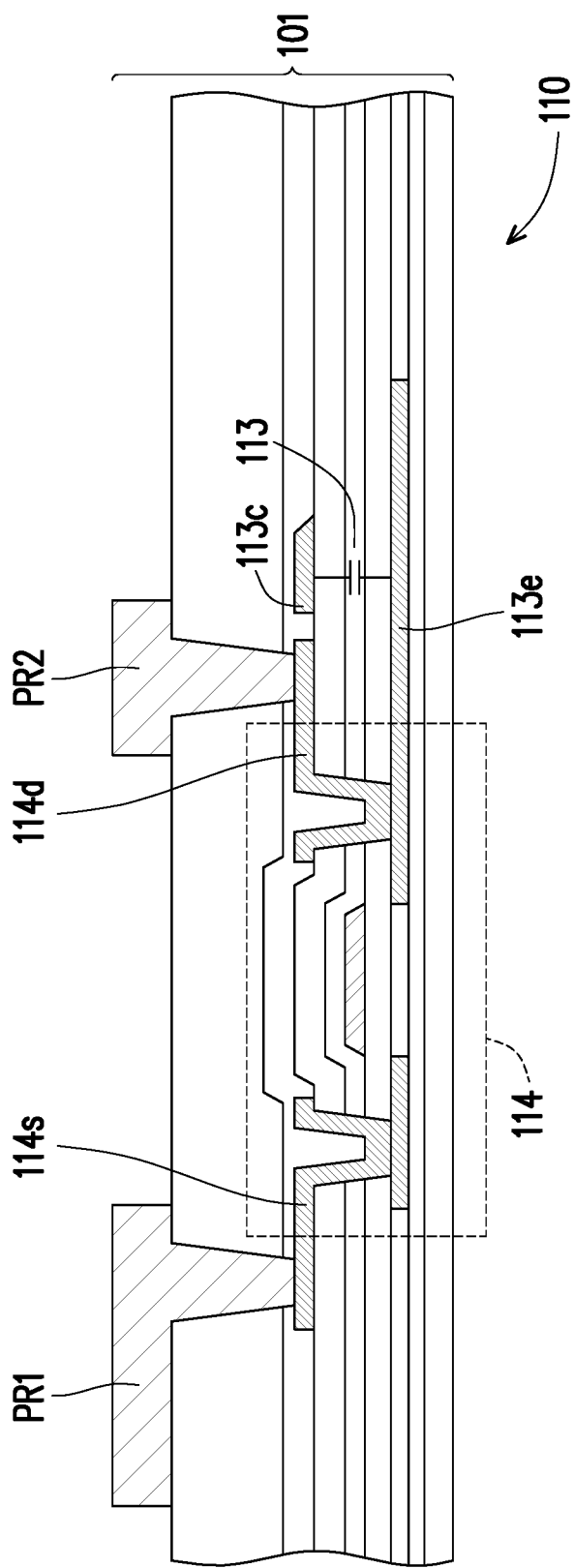
FIG. 5 is a cross-sectional schematic view of a layout structure of an ESD protection apparatus according to still another embodiment of the disclosure.

FIG. 5 is a cross-sectional schematic view of a layout structure of an ESD protection apparatus according to still another embodiment of the disclosure. Descriptions of the RDL structure 101, the ESD protection apparatus 110, the transistor 114, the source electrode 114s, the drain electrode 114d, the first power rail PR1, and the second power rail PR2 illustrated in FIG. 5 may be inferred with reference to the related descriptions of the RDL structure 101, the ESD protection apparatus 110, the transistor 114, the source electrode 114s, the drain electrode 114d, the first power rail PR1, and the second power rail PR2 illustrated in FIG. 3, shall not be repeatedly described here.

Please refer to FIG. 1 and FIG. 5. In the embodiment illustrated in FIG. 5, the electrode plate 113c of the capacitor 113 is disposed in the second metal layer of the RDL structure 101. The other electrode plate 113e of the capacitor 113 is disposed in a polysilicon layer (generally known as a POLY layer) of the RDL structure 101. The electrode plate 113e is stacked under the electrode plate 113c to form the capacitor 113. The electrode plate 113e is electrically connected to the drain electrode 114d of the transistor 114. The electrode plate 113c of the capacitor 113 may be electrically connected to the gate of the transistor 114.

Based on design requirements, in some embodiments, the capacitor 113 illustrated in FIG. 1 may be adopted as a parallel connection design. For example, the capacitor 113 may include a first capacitor C1 and a second capacitor C2 in parallel connection with each other. The first capacitor C1 and the second capacitor C2 are disposed in the RDL structure 101. A first terminal of the first capacitor C1 and a first terminal of the second capacitor C2 are coupled to the second terminal of the impedance 112 as illustrated in FIG. 1. A second terminal of the first capacitor C1 and the second terminal of the second capacitor C2 are coupled to the second power rail PR2. A conductive component of the RDL structure 101 is applied as an electrode plate of the second capacitor C2. In a vertical projection of the RDL structure 101, the conductive component completely overlaps or partially overlaps the first capacitor C1.

Figure 6:
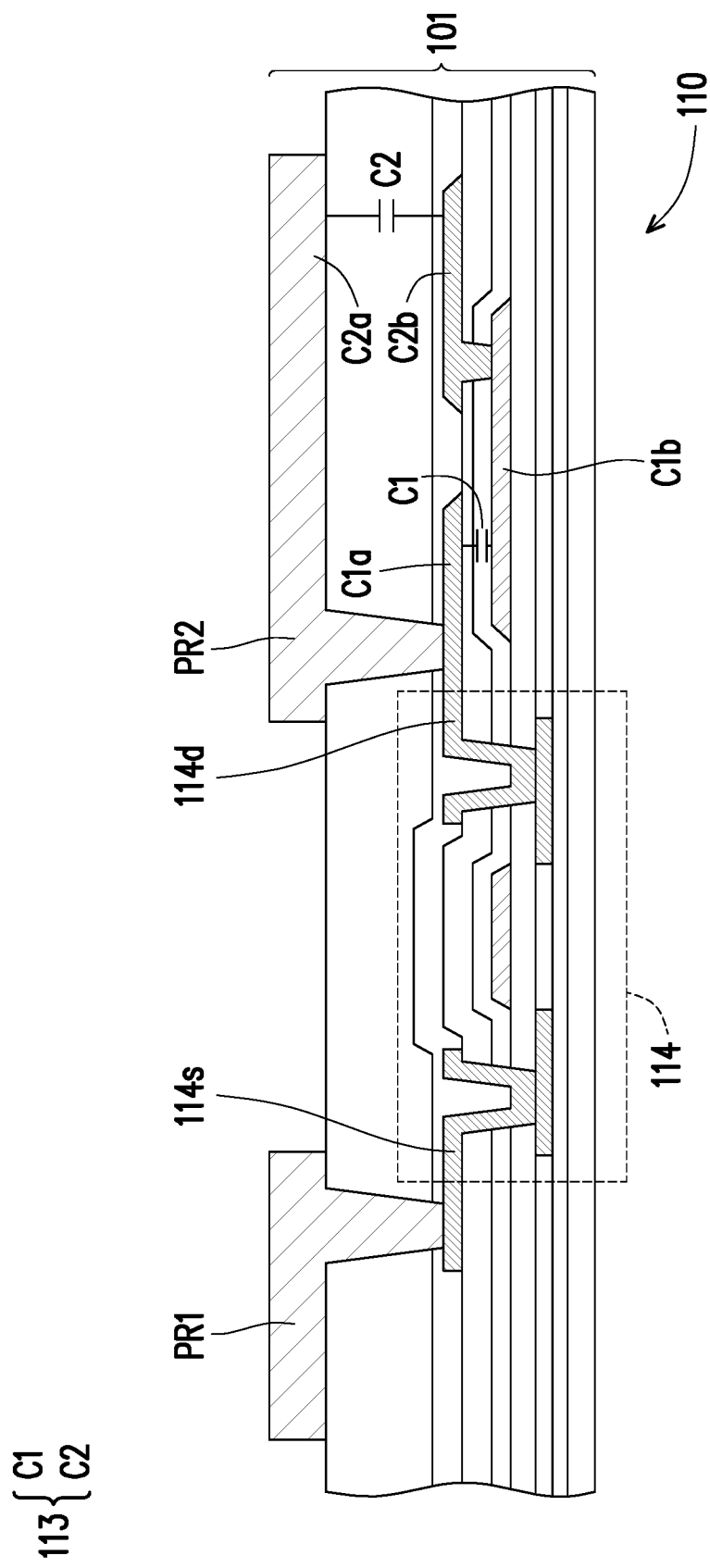
FIG. 6 is a cross-sectional schematic view of a layout structure of an ESD protection apparatus according to yet another embodiment of the disclosure.

For instance, FIG. 6 is a cross-sectional schematic view of a layout structure of an ESD protection apparatus according to yet another embodiment of the disclosure. Descriptions of the RDL structure 101, the ESD protection apparatus 110, the transistor 114, the source electrode 114s, the drain electrode 114d, the first power rail PR1, and the second power rail PR2 illustrated in FIG. 6 may be inferred with reference to the related descriptions of the RDL structure 101, the ESD protection apparatus 110, the transistor 114, the source electrode 114s, the drain electrode 114d, the first power rail PR1, and the second power rail PR2 illustrated in FIG. 3, and shall not be repeatedly described here.

Please refer to FIG. 1 and FIG. 6. In the embodiment illustrated in FIG. 6, the capacitor 113 includes the first capacitor C1 and the second capacitor C2 in parallel connection with each other. An electrode plate C1a of the first capacitor C1 is disposed in the second metal layer of the RDL structure 101. The electrode plate C1a is electrically connected to the drain electrode 114d of the transistor 114. The other electrode plate C1b of the first capacitor C1 is disposed in a first metal layer of the RDL structure 101. The electrode plate C1b is stacked under the electrode plate C1a to form the first capacitor C1. A portion of the second power rail PR2 (the conductive component) of the RDL structure 101 is applied as an electrode plate C2a of the second capacitor C2. The other electrode plate C2b of the second capacitor C2 is disposed in the second metal layer of the RDL structure 101. The electrode plate C2b may be electrically coupled to the electrode plate C1b through the via plug. The electrode plate C2b is stacked under the electrode plate C2a to form the second capacitor C2. The electrode plate C1b of the first capacitor C1 and the electrode plate C2b of the second capacitor C2 may be electrically connected to the gate of the transistor 114. In the vertical projection of the redistribution layer structure 101, the electrode plate C2a (the conductive component) completely overlaps or partially overlaps the first capacitor C1 to reduce the layout area of the capacitor 113.

Figure 7:
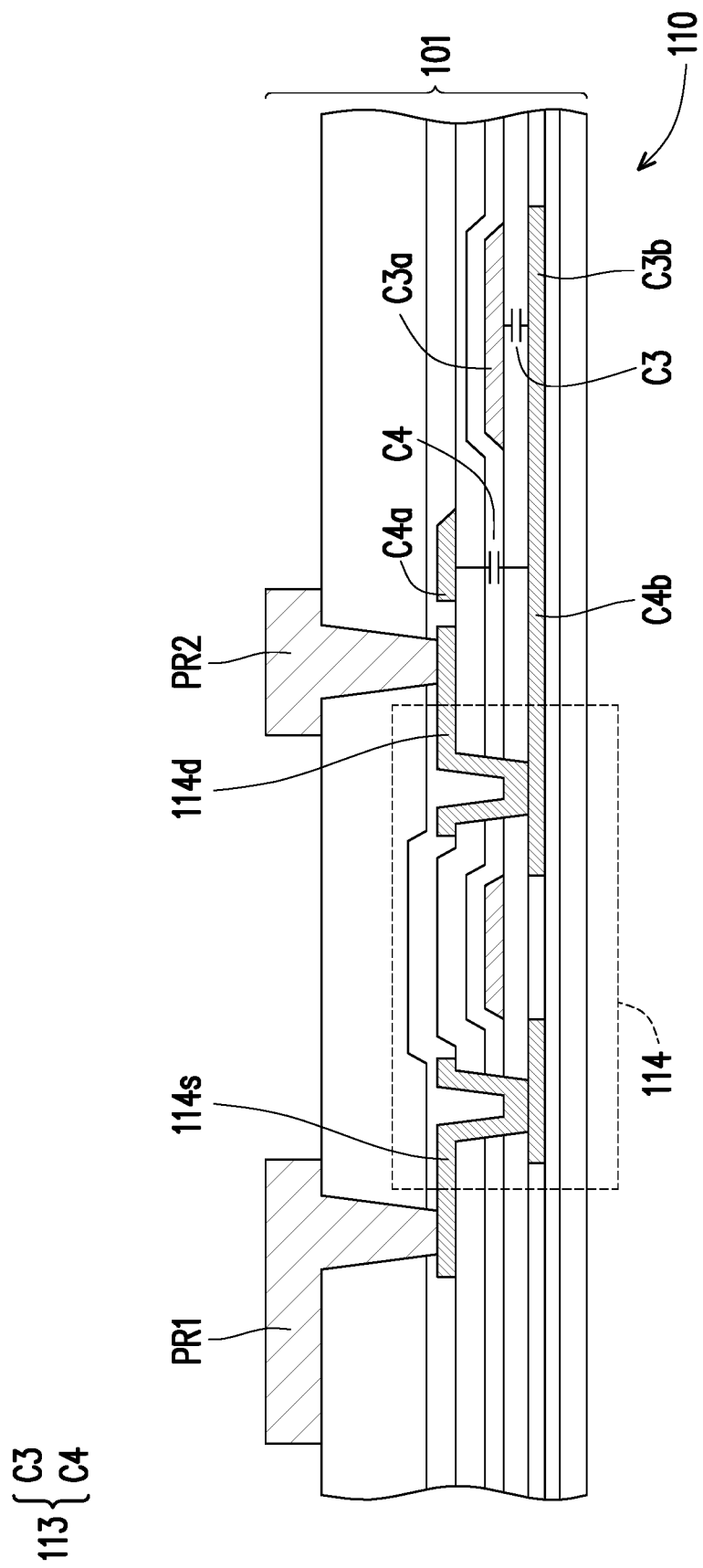
FIG. 7 is a cross-sectional schematic view of a layout structure of an ESD protection apparatus according to a further embodiment of the disclosure.

FIG. 7 is a cross-sectional schematic view of a layout structure of an ESD protection apparatus according to a further embodiment of the disclosure. Descriptions of the RDL structure 101, the ESD protection apparatus 110, the transistor 114, the source electrode 114s, the drain electrode 114d, the first power rail PR1, and the second power rail PR2 illustrated in FIG. 7 may be referred to the RDL structure 101, the ESD protection apparatus 110, the transistor 114, the source electrode 114s, the drain electrode 114d, the first power rail PR1, and the second power rail PR2 illustrated in FIG. 3, and shall not be repeatedly described here.

Please refer to FIG. 1 and FIG. 7. In the embodiment illustrated in FIG. 7, the capacitor 113 includes a first capacitor C3 and a second capacitor C4 in parallel connection with each other. An electrode plate C3a of the first capacitor C3 is disposed in the first metal layer of the RDL structure 101. The other electrode plate C3b of the first capacitor C3 is disposed in the polysilicon layer of the RDL structure 101. The electrode plate C3b is stacked under the electrode plate C3a to form the first capacitor C3. An electrode plate C4a of the second capacitor C4 is disposed in the second metal layer of the RDL structure 101. The electrode plate C3a of the first capacitor C3 and the electrode plate C4a of the second capacitor C4 may be electrically connected to the gate of the transistor 114. The other electrode plate C4b of the second capacitor C4 is disposed in the polysilicon layer of the RDL structure 101. The electrode plate C4b and the electrode plate C3b are electrically connected to the drain electrode 114d of the transistor 114. The electrode plate C4b is stacked under the electrode plate C4a to form the second capacitor C4.

Figure 8:
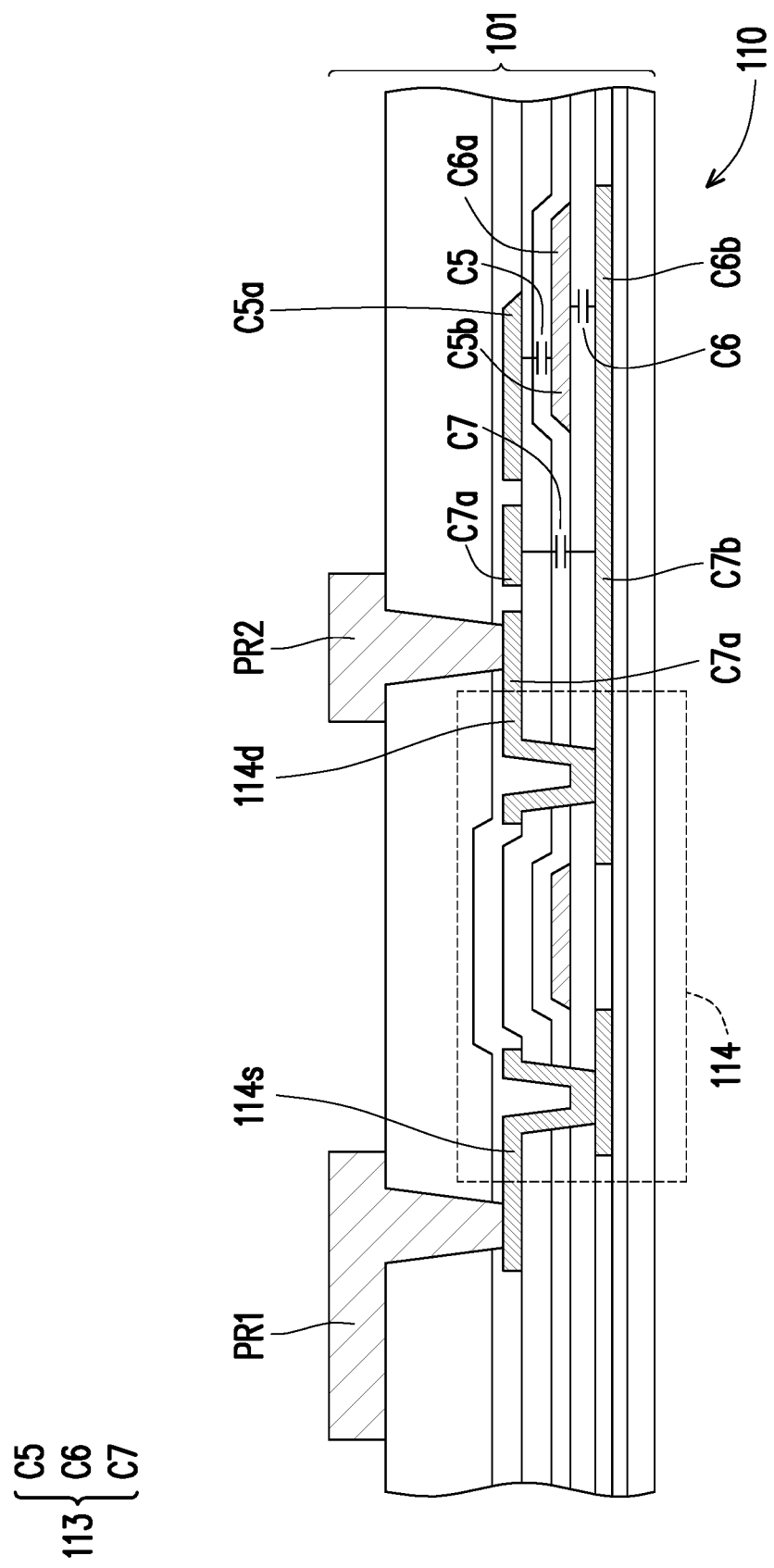
FIG. 8 is a cross-sectional schematic view of a layout structure of an ESD protection apparatus according to another embodiment of the disclosure.

FIG. 8 is a cross-sectional schematic view of a layout structure of an ESD protection apparatus according to another embodiment of the disclosure. Descriptions of the RDL structure 101, the ESD protection apparatus 110, the transistor 114, the source electrode 114s, the drain electrode 114d, the first power rail PR1, and the second power rail PR2 illustrated in FIG. 8 may be inferred with reference to the related descriptions of the RDL structure 101, the ESD protection apparatus 110, the transistor 114, the source electrode 114s, the drain electrode 114d, the first power rail PR1, and the second power rail PR2 illustrated in FIG. 3, and shall not be repeatedly described here.

Please refer to FIG. 1 and FIG. 8. In the embodiment illustrated in FIG. 8, the capacitor 113 includes a first capacitor C5, a second capacitor C6, and a third capacitor C7 in parallel connection with each other. An electrode plate C5a of the first capacitor C5 is disposed in the second metal layer of the RDL structure 101. The electrode plate C5a is electrically connected to the drain electrode 114d of the transistor 114. The other electrode plate C5b of the first capacitor C5 is disposed in the first metal layer of the RDL structure 101. The electrode plate C5b may be electrically connected to the gate of the transistor 114. The electrode plate C5b is stacked under the electrode plate C5a to form the first capacitor C5. An electrode plate C6a of the second capacitor C6 is disposed in the first metal layer of the RDL structure 101. The electrode plate C6a is electrically connected to the electrode plate C5b. The other electrode plate C6b of the second capacitor C6 is disposed in the polysilicon layer of the RDL structure 101. The electrode plate C6b is electrically connected to the drain electrode 114d of the transistor 114. The electrode plate C6b is stacked under the electrode plate C6a to form the second capacitor C6. An electrode plate C7a of the third capacitor C7 is disposed in the second metal layer of the RDL structure 101. The electrode plate C7a may be electrically connected to the gate of the transistor 114. The other electrode plate C7b of the third capacitor C7 is disposed in the polysilicon layer of the RDL structure 101. The electrode plate C7b is electrically connected to the electrode plate C6b and the drain electrode 114d of the transistor 114. The electrode plate C7b is stacked under the electrode plate C7a to form the third capacitor C7.

Figure 9:
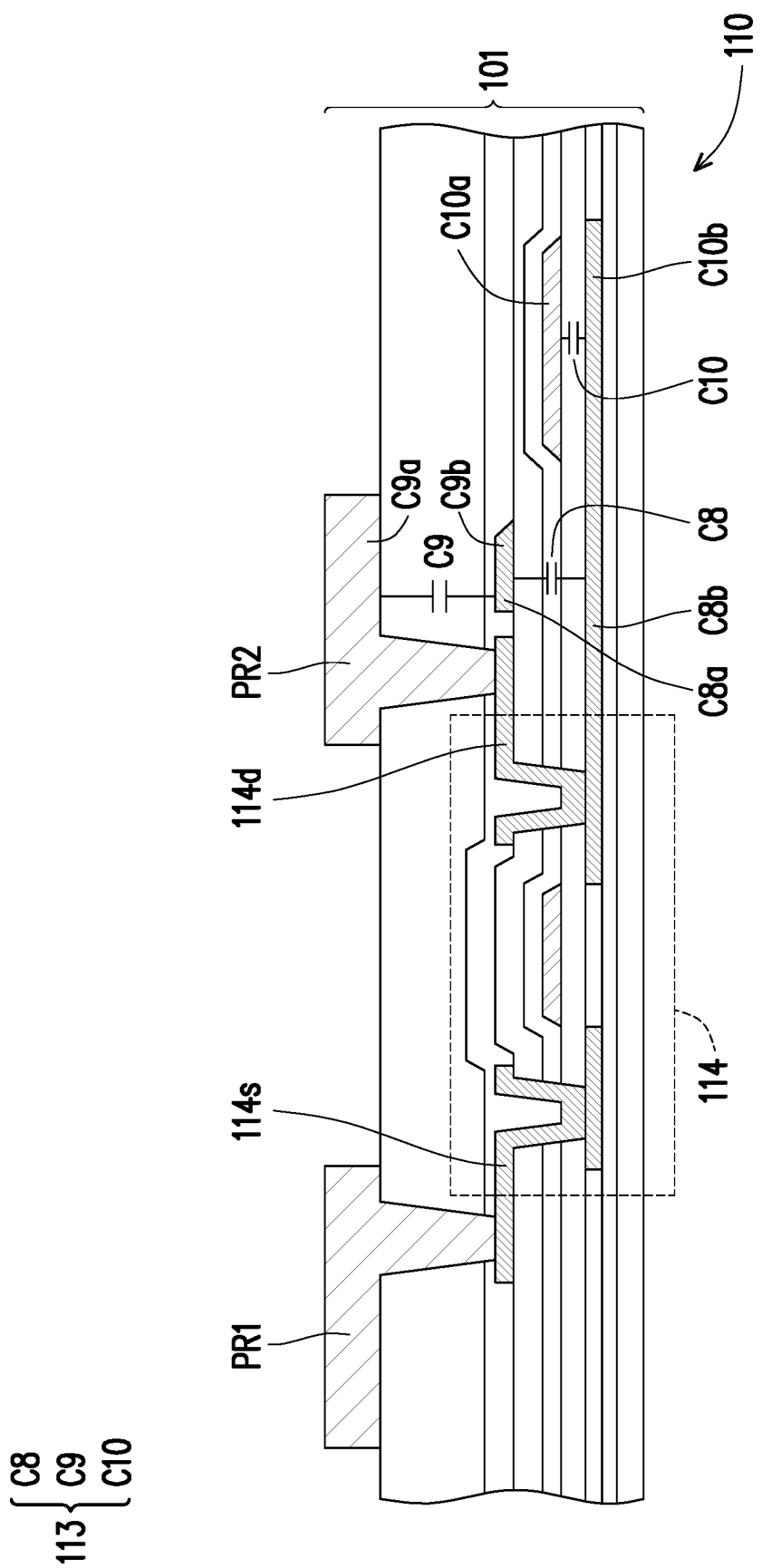
FIG. 9 is a cross-sectional schematic view of a layout structure of an ESD protection apparatus according to still another embodiment of the disclosure.

FIG. 9 is a cross-sectional schematic view of a layout structure of an ESD protection apparatus according to still another embodiment of the disclosure. Descriptions of the RDL structure 101, the ESD protection apparatus 110, the transistor 114, the source electrode 114s, the drain electrode 114d, the first power rail PR1, and the second power rail PR2 illustrated in FIG. 9 may be referred to the RDL structure 101, the ESD protection apparatus 110, the transistor 114, the source electrode 114s, the drain electrode 114d, the first power rail PR1, and the second power rail PR2 illustrated in FIG. 3, and shall not be repeatedly described here.

Please refer to FIG. 1 and FIG. 9. In the embodiment illustrated in FIG. 9, the capacitor 113 includes a first capacitor C8, the second capacitor C9, and a third capacitor C10 in parallel connection with each other. An electrode plate C8a of the first capacitor C8 is disposed in the second metal layer of the RDL structure 101. The electrode plate C8a is electrically connected to the gate of the transistor 114. The other electrode plate C8b of the first capacitor C8 is disposed in the polysilicon layer of the RDL structure 101. The electrode plate C8b is electrically connected to the drain electrode 114d of the transistor 114. The electrode plate C8b is stacked under the electrode plate C8a to form the first capacitor C8. A portion of the second power rail PR2 (the conductive component) of the RDL structure 101 is applied as an electrode plate C9a of the second capacitor C9. The other electrode plate C9b of the second capacitor C9 is disposed in the second metal layer of the RDL structure 101. The electrode plate C9b is electrically connected to the electrode plate C8a. The electrode plate C9b is stacked under the electrode plate C9a to form the second capacitor C9. An electrode plate C10a of the third capacitor C10 is disposed in the first metal layer of the RDL structure 101. The electrode plate C10a may be electrically connected to the gate of the transistor 114. The other electrode plate C10b of the third capacitor C10 is disposed in the polysilicon layer of the RDL structure 101. The electrode plate C10b is electrically connected to the drain electrode 114d of the transistor 114. The electrode plate C10b is stacked under the electrode plate C10a to form the third capacitor C10.

Figure 10:
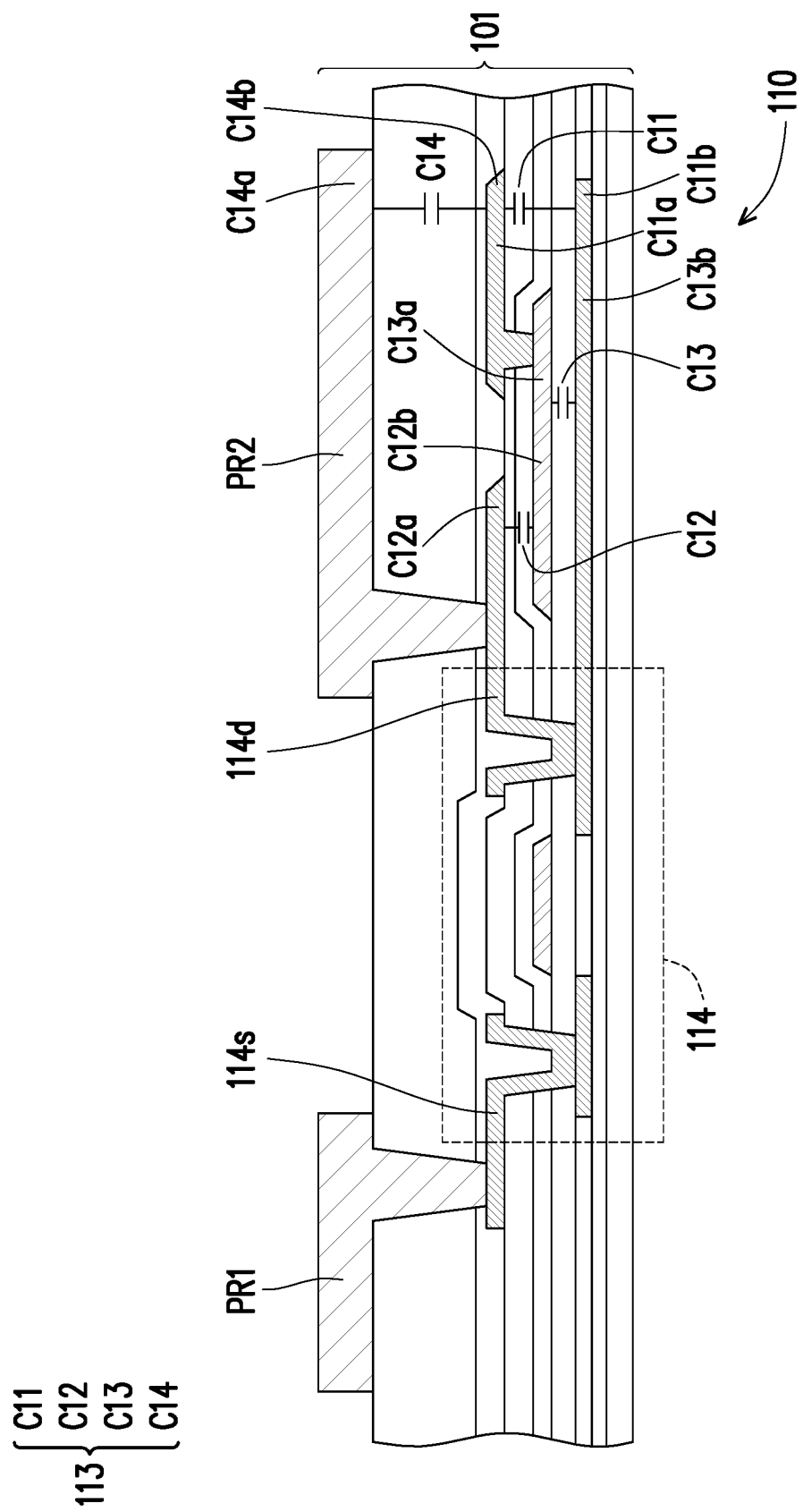
FIG. 10 is a cross-sectional schematic view of a layout structure of an ESD protection apparatus according to yet another embodiment of the disclosure.

FIG. 10 is a cross-sectional schematic view of a layout structure of an ESD protection apparatus according to yet another embodiment of the disclosure. Descriptions of the RDL structure 101, the ESD protection apparatus 110, the transistor 114, the source electrode 114s, the drain electrode 114d, the first power rail PR1, and the second power rail PR2 illustrated in FIG. 10 may be referred to related descriptions of the RDL structure 101, the ESD protection apparatus 110, the transistor 114, the source electrode 114s, the drain electrode 114d, the first power rail PR1, and the second power rail PR2 illustrated in FIG. 3, and shall not be repeatedly described here.

Please refer to FIG. 1 and FIG. 10. In the embodiment illustrated in FIG. 10, the capacitor 113 includes a first capacitor C11, a second capacitor C12, a third capacitor C13, and a fourth capacitor C14 in parallel connection with each other. An electrode plate C11a of the first capacitor C11 is disposed in the second metal layer of the RDL structure 101. The electrode plate C11a may be electrically connected to the gate of the transistor 114. The other electrode plate C11b of the first capacitor C11 is disposed in the polysilicon layer of the RDL structure 101. The electrode plate C11b is electrically connected to the drain electrode 114d of the transistor 114. The electrode plate C11b is stacked under the electrode plate C11a to form the first capacitor C11. An electrode plate C12a of the second capacitor C12 is disposed in the second metal layer of the RDL structure 101. The electrode plate C12a is electrically connected to the drain electrode 114d of the transistor 114. The other electrode plate C12b of the second capacitor C12 is disposed in the first metal layer of the RDL structure 101. The electrode plate C12b may be electrically connected to the gate of the transistor 114. The electrode plate C12b is stacked under the electrode plate C12a to form the second capacitor C12.

An electrode plate C13a of the third capacitor C13 is disposed in the first metal layer of the RDL structure 101. The electrode plate C13a is electrically connected to the electrode plate C12b. The other electrode plate C13b of the third capacitor C13 is disposed in the polysilicon layer of the RDL structure 101. The electrode plate C13b is electrically connected to the drain electrode 114d of the transistor 114. The electrode plate C13b is stacked under the electrode plate C13a to form the third capacitor C13. A portion of the second power rail PR2 (the conductive component) of the redistribution layer structure 101 is applied as an electrode plate C14a of the fourth capacitor C14. The other electrode plate C14b of the fourth capacitor C14 is disposed in the second metal layer of the RDL structure 101. The electrode plate C14b is electrically connected to the electrode plate C11a. The electrode plate C14b is electrically connected to the electrode plate C13a through the via plug. The electrode plate C14b is stacked under the electrode plate C14a to form the fourth capacitor C14.

Figure 11:
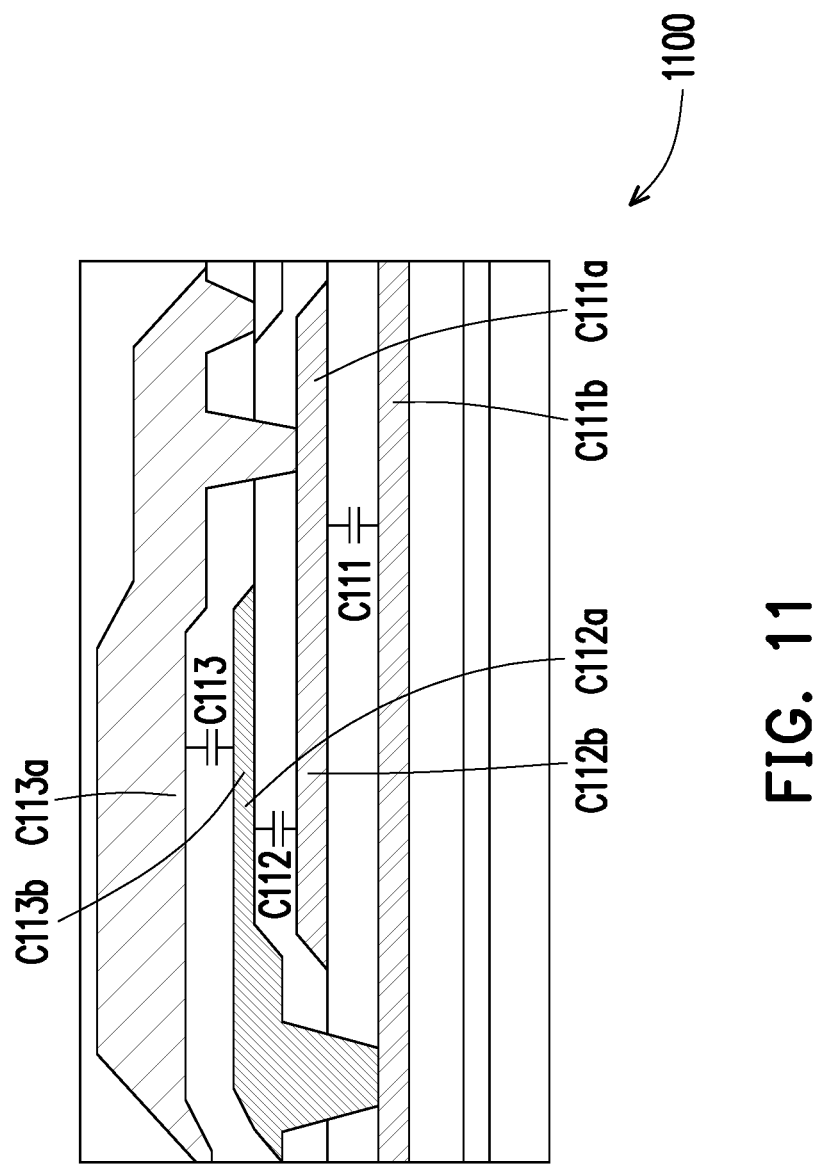
FIG. 11 is a cross-sectional schematic view illustrating a layout structure of an integrated passive device (IPD) with capacitors according to an embodiment of the disclosure.

FIG. 11 is a cross-sectional schematic view of a layout structure of an integrated passive device (IPD) with capacitors according to an embodiment of the disclosure. Regarding the capacitor 1100 illustrated in FIG. 11, the related descriptions may be referred with reference to the descriptions of the capacitor 113 illustrated in FIG. 1. In the embodiment illustrated in FIG. 11, the capacitor 1100 includes a first capacitor C111, a second capacitor C112, and a third capacitor C113 in parallel connection with each other. An electrode plate C111a of the first capacitor C111 is disposed in the second metal layer (generally known as the M2 layer). The other electrode C111b of the first capacitor C111 is disposed in the first metal layer (generally known as the M1 layer). The electrode plate C111b is stacked under the electrode plate C111a to form the first capacitor C111. An electrode plate C112a (the conductive component) of the second capacitor C112 is disposed in a third metal layer (generally known as a M3 layer). The electrode plate C112a is electrically connected to the electrode plate C111b through the via plug. The other electrode plate C112b of the second capacitor C112 is disposed in the second metal layer. The electrode plate C112b is electrically connected to the electrode plate C111a. The electrode plate C112b is stacked under the electrode plate C112a to form the second capacitor C112. In a vertical projection of the capacitor 1100, the electrode plate C112a (the conductive component) completely overlaps or partially overlaps the first capacitor C111.

An electrode plate C113a (the conductive component) of the third capacitor C113 is disposed in the RDL layer. The electrode plate C113a is electrically connected to the electrode plate C111a through the via plug. The other electrode plate C113b of the third capacitor C113 is disposed in the third metal layer. The electrode plate C113b is electrically connected to the electrode plate C112a. The electrode plate C113b is stacked under the electrode plate C113a to form the third capacitor C113. In the vertical projection of the capacitor 1100, the electrode plate C113a (the conductive component) completely overlaps or partially overlaps the first capacitor C111 and the second capacitor C112.

As illustrated in FIG. 11, the first capacitor C111, the second capacitor C112 and the third capacitor C113 are stacked and disposed on each other in an interdigitated manner. Therefore, the layout area of the capacitor 1100 may be effectively reduced. The capacitor 1100 may be applied to any circuit, for example, radio frequency (RF) circuits, etc. For example, the capacitor 1100 may be applied to a harmonic filter, coupler, combiner, divider or other circuits/apparatus.

In the embodiment illustrated in FIG. 1, the control terminal (for example, a gate) of the transistor 115 is coupled to the first power rail PR1 (for example, a system voltage rail), while the control terminal (for example, a gate) of the transistor 116 is coupled to the signal pin SP1. In other embodiments, the control terminal of the transistor 115 and/or the control terminal of the transistor 116 may be coupled to the second terminal of the impedance 112 and the first terminal of the capacitor 113.

Figure 12:
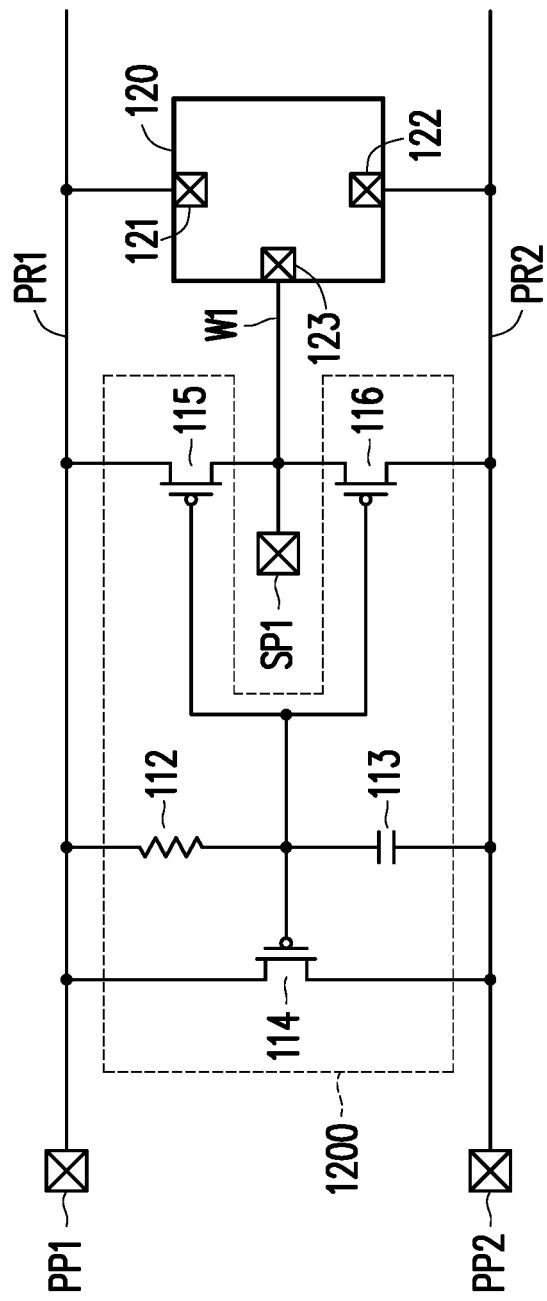
FIG. 12 is a circuit block diagram illustrating an ESD protection apparatus according to another embodiment of the disclosure.

For example, FIG. 12 is a circuit block diagram of an ESD protection apparatus 1200 according to another embodiment of the disclosure. The ESD protection apparatus 1200 includes the impedance 112, the capacitor 113, the transistor 114, the transistor 115, and the transistor 116. Descriptions of the first power pin PP1, the first power rail PR1, the second power pin PP2, the second power rail PR2, the ESD protection apparatus 1200, the impedance 112, the capacitor 113, the transistor 114, the transistor 115, the transistor 116, the signal pin SP1, and the integrated circuit 120 illustrated in FIG. 12 may be inferred with reference to the related descriptions of the first power pin PP1, the first power rail PR1, the second power pin PP2, the second power rail PR2, the ESD protection apparatus 110, the impedance 112, the capacitor 113, the transistor 114, the transistor 115, the transistor 116, the signal pin SP1, and the integrated circuit 120 illustrated in FIG. 1, and shall not be repeatedly described here.

In the embodiment illustrated in FIG. 12, the control terminal (for example, a gate) of the transistor 115 and the control terminal (for example, a gate) of the transistor 116 are coupled to the second terminal of the impedance 112 and the first terminal of the capacitor 113. The first terminal (for example, a drain) of the transistor 115 and the first terminal (for example, a source) of the transistor 116 are coupled to the signal pin SP1. The second terminal (for example, a source) of the transistor 115 is coupled to the first power rail PR1. The second terminal (for example, a drain) of the transistor 116 is coupled to the second power rail PR2.

Figure 13:
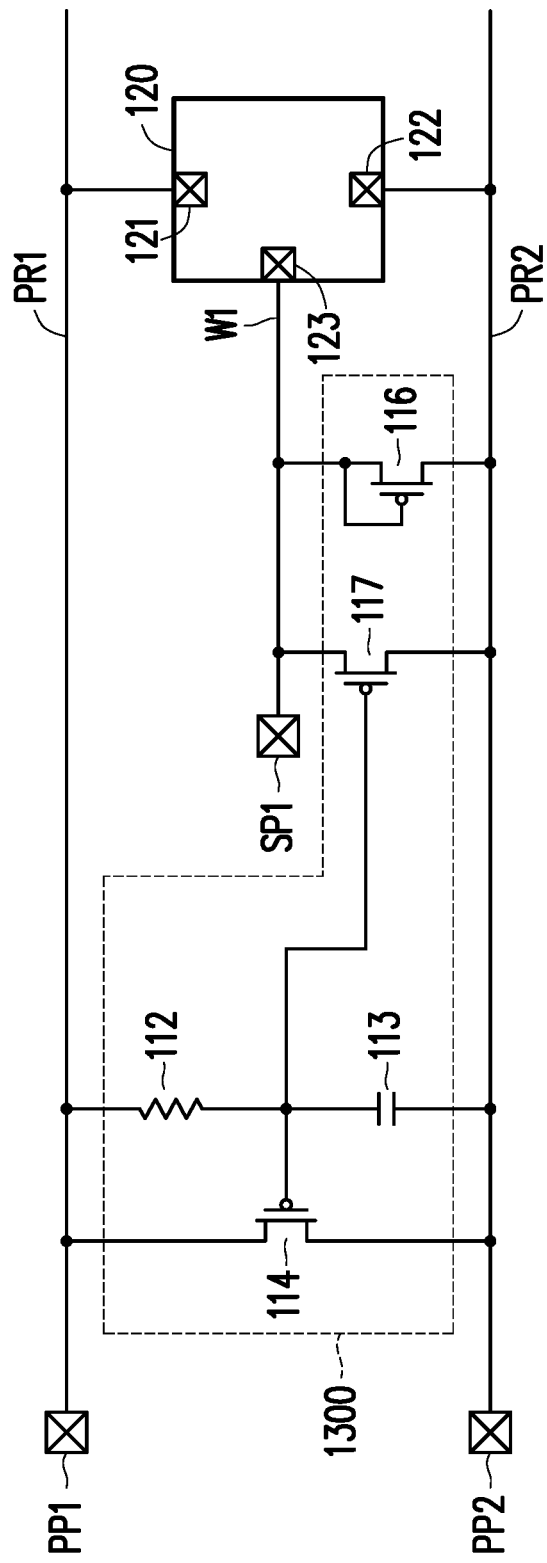
FIG. 13 is a circuit block diagram illustrating an ESD protection apparatus according to still another embodiment of the disclosure.

FIG. 13 is a circuit block diagram of an ESD protection apparatus according to still another embodiment of the disclosure. An ESD protection apparatus 1300 illustrated in FIG. 13 includes the impedance 112, the capacitor 113, the transistor 114, the transistor 116, and a transistor 117. The descriptions of the first power pin PP1, the first power rail PR1, the second power pin PP2, the second power rail PR2, the ESD protection apparatus 1300, the impedance 112, the capacitor 113, the transistor 114, the transistor 116, the signal pin SP1, and the integrated circuit 120 illustrated in FIG. 13 may be inferred with reference to the related descriptions of the first power pin PP1, the first power rail PR1, the second power pin PP2, the second power rail PR2, the ESD protection apparatus 110, the impedance 112, the capacitor 113, the transistor 114, the transistor 115, the transistor 116, the signal pin SP1, and the integrated circuit 120 illustrated in FIG. 1, and shall not be repeatedly described here.

In the embodiment illustrated in FIG. 13, the transistor 117 is disposed in the RDL structure. A control terminal (for example, a gate) of the transistor 117 is coupled to the second terminal of the impedance 112 and the first terminal of the capacitor 113. The first terminal (for example, a source) of the transistor 117 is coupled to the signal pin SP1. The second terminal (for example, a drain) of the transistor 117 is coupled to the second power rail PR2.

Figure 14:
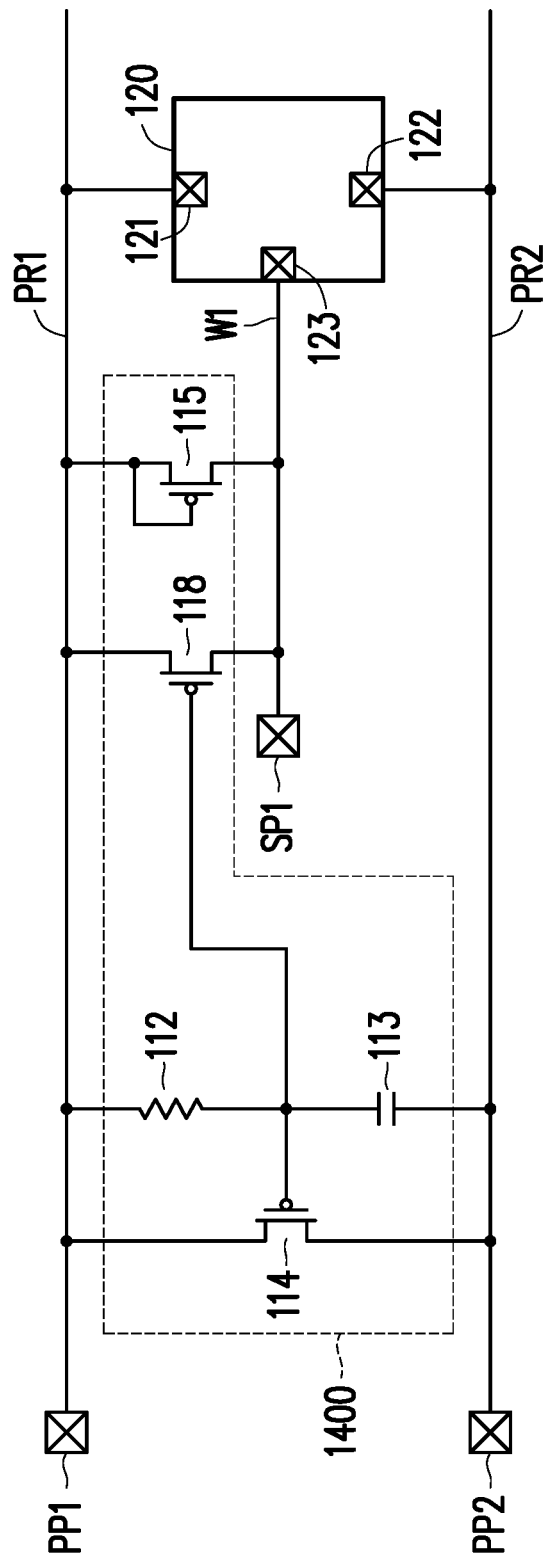
FIG. 14 is a circuit block diagram illustrating an ESD protection apparatus according to yet another embodiment of the disclosure.

FIG. 14 is a circuit block diagram of an ESD protection apparatus according to yet another embodiment of the disclosure. An ESD protection apparatus 1400 illustrated in FIG. 14 includes the impedance 112, the capacitor 113, the transistor 114, the transistor 115, and a transistor 118. The descriptions of the first power pin PP1, the first power rail PR1, the second power pin PP2, the second power rail PR2, the ESD protection apparatus 1400, the impedance 112, the capacitor 113, the transistor 114, the transistor 115, the signal pin SP1, and the integrated circuit 120 illustrated in FIG. 14 may be inferred with reference to the related descriptions of the first power pin PP1, the first power rail PR1, the second power pin PP2, the second power rail PR2, the ESD protection apparatus 110, the impedance 112, the capacitor 113, the transistor 114, the transistor 115, the signal pin SP1, and the integrated circuit 120 illustrated in FIG. 1, and shall not be repeatedly described here.

In the embodiment illustrated in FIG. 14, the transistor 118 is disposed in the RDL structure. A control terminal (for example, a gate) of the transistor 118 is coupled to the second terminal of the impedance 112 and the first terminal of the capacitor 113. The first terminal (for example, a drain) of the transistor 118 is coupled to the signal pin SP1. The second terminal (for example, a source) of the transistor 118 is coupled to the first power rail PR1.

Figure 15:
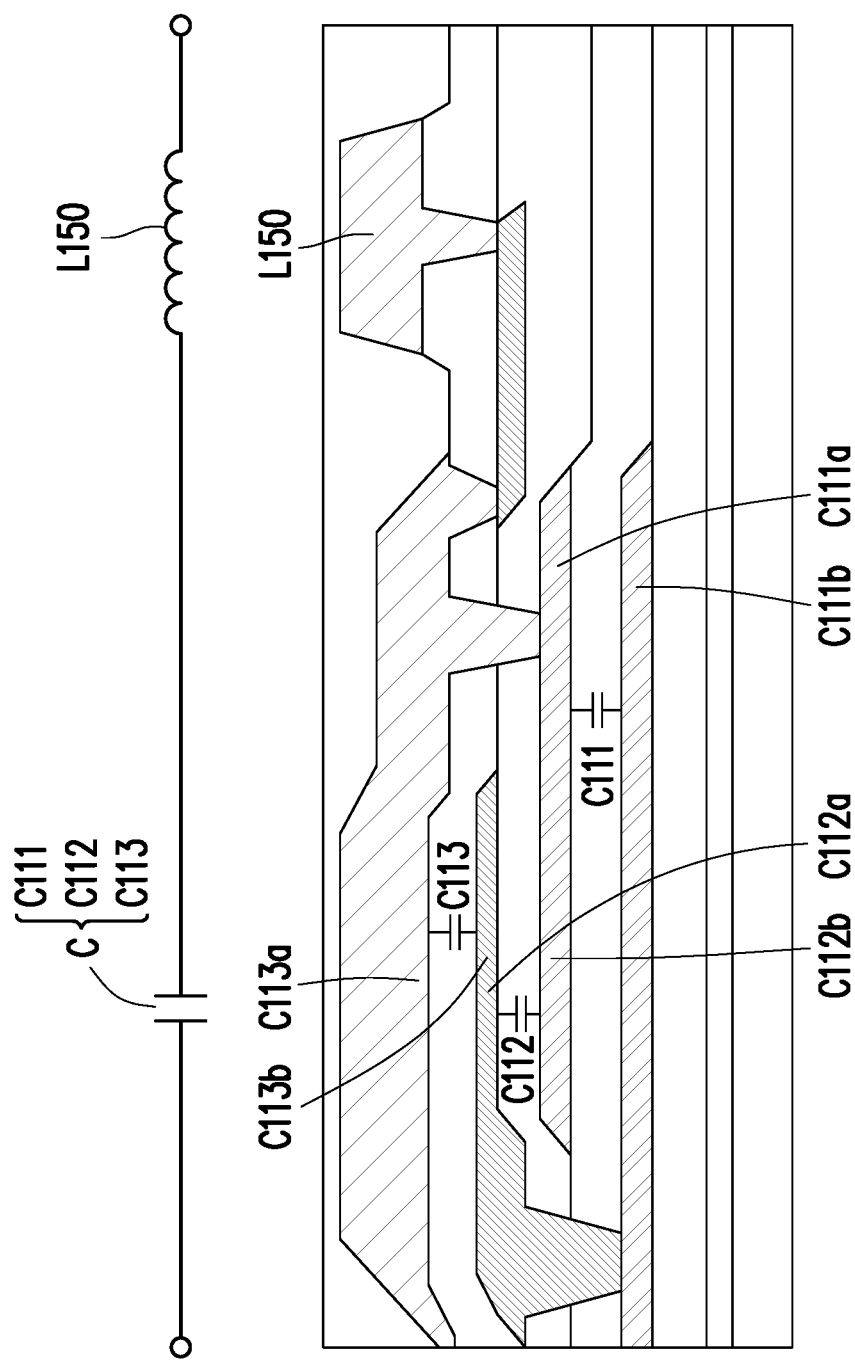
FIG. 15 is a cross-sectional schematic view of a layout structure of an IPD with capacitors according to an embodiment of the disclosure.

FIG. 15 is a cross-sectional schematic view of a layout structure of an IPD with capacitors according to an embodiment of the disclosure. The IPD illustrated in FIG. 15 includes the first capacitor C111, the second capacitor C112 and the third capacitor C113 in parallel connection with each other. The first capacitor C111, the second capacitor C112 and the third capacitor C113 illustrated in FIG. 15 may be inferred with reference to the related descriptions of the first capacitor C111, the second capacitor C112 and the third capacitor C113 illustrated in FIG. 11. Based on design requirements, the total capacitance of the first capacitor C111, the second capacitor C112 and the third capacitor C113 may be a plurality of nF or more.

In the embodiment illustrated in FIG. 15, the IPD further includes an inductance L150. The inductance L150 may include a plurality of inductances in parallel connection, so as to add an inductance value. The layout of the inductance L150 may be determined based on design requirements. For example, in some application examples, the layout structure of the inductance L150 may be conventional layouts of the inductance or other layouts of the inductance. Based on design requirements, the inductance value of the inductance L150 may be tens of nF or more. The inductance L150 may be electrically connected to the first capacitor C111, the second capacitor C112 and the third capacitor C113 through the third metal layer or the RDL layer. Materials of the inductance L150 may be any metal with low resistances.

The equivalent capacitance of the capacitors (that is, the first capacitor C111, the second capacitor C112, and the third capacitor C113) are connected in parallel by the inductance L150 illustrated in FIG. 15. Therefore, in some application examples, the IPD illustrated in FIG. 15 may be applied as an LC series resonant circuit. Through a thin film transistor TFT manufacturing process, the IPD illustrated in FIG. 15 may be integrated in all kinds of circuits, so that products are smaller in size and thinner in thickness, and thus further improves product performance.

In summary of the above, active components, such as the thin film transistor (TFT), may be adopted as ESD protection components of the ESD protection apparatus of the embodiments of the disclosure, and the active components may be incorporated into the RDL layer of the package. The TFT manufacturing process may be incorporated into the RDL manufacturing process. Through the TFT manufacturing process, the IPD may be realized, where the ESD protection circuit or a capacitor required for the IPD is adopted as a parallel connection layout design. In addition, at least one capacitor uses the metal electroplating layer of the RDL as the electrode plate, so as to reduce the total layout space of the active and inactive components inside the RDL structure.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An electrostatic discharge protection apparatus, comprising:
a first transistor, disposed in a redistribution layer structure of a package, wherein a first terminal and a second terminal of the first transistor are respectively coupled to a first power rail and a second power rail of the redistribution layer structure, at least one integrated circuit is accommodated in the package, a first power pad and a second power pad of the at least one integrated circuit are respectively coupled to the first power rail and the second power rail of the redistribution layer structure, wherein the first terminal and the second terminal of the first transistor are respectively connected to a first contact and a second contact disposed in the same metal layer of the redistribution layer structure;
an impedance, disposed in the redistribution layer structure, wherein a first terminal of the impedance is coupled to the first power rail, and a second terminal of the impedance is coupled to a control terminal of the first transistor; and
a capacitor, disposed in the redistribution layer structure, wherein a first terminal of the capacitor is coupled to the second terminal of the impedance, a second terminal of the capacitor is coupled to the second power rail.

2. The electrostatic discharge protection apparatus according to claim 1, wherein when the first power rail is a system voltage rail, the second power rail is a reference voltage rail, and when the first power rail is the reference voltage rail, the second power rail is the system voltage rail.

3. The electrostatic discharge protection apparatus according to claim 1, wherein the first transistor is a thin film transistor, a semiconductor material of the thin film transistor comprises polysilicon, metallic oxide, or micro-crystalline silicon.

4. The electrostatic discharge protection apparatus according to claim 1, wherein the first transistor is a P-type low-temperature polysilicon thin film transistor.

5. The electrostatic discharge protection apparatus according to claim 1, wherein the capacitor comprises:
a first capacitor, disposed in the redistribution layer structure, wherein a first terminal of the first capacitor is coupled to the second terminal of the impedance, a second terminal of the first capacitor is coupled to the second power rail; and
a second capacitor, disposed in the redistribution layer structure, wherein a first terminal of the second capacitor is coupled to the second terminal of the impedance, a second terminal of the second capacitor is coupled to the second power rail, a conductive component of the redistribution layer structure is applied as an electrode plate of the second capacitor,
wherein in a vertical projection of the redistribution layer structure, the conductive component completely overlaps or partially overlaps the first capacitor.

6. The electrostatic discharge protection apparatus according to claim 1, further comprising:
a second transistor, disposed in the redistribution layer structure, wherein a control terminal of the second transistor is coupled to the second terminal of the impedance and the first terminal of the capacitor, a first terminal of the second transistor is coupled to a signal pin of the package, a second terminal of the second transistor is coupled to the first power rail or the second power rail,
wherein a signal pad of the at least one integrated circuit is coupled to the signal pin of the package through the redistribution layer structure.

7. The electrostatic discharge protection apparatus according to claim 6, further comprising:
a third transistor, disposed in the redistribution layer structure, wherein a control terminal of the third transistor is coupled to the second terminal of the impedance and the first terminal of the capacitor, a first terminal of the third transistor is coupled to the signal pin of the package,
wherein when the second terminal of the second transistor is coupled to the first power rail, a second terminal of the third transistor is coupled to the second power rail, and when the second terminal of the second transistor is coupled to the second power rail, the second terminal of the third transistor is coupled to the first power rail.

8. An integrated passive device with capacitors, comprising:
- a first capacitor, disposed in a redistribution layer structure of a package, wherein at least one integrated circuit is accommodated in the package, at least one pad of the at least one integrated circuit is respectively coupled to at least one pin of the package through the redistribution layer structure; and
- a second capacitor, disposed in the redistribution layer structure, wherein a first terminal of the second capacitor is coupled to a first terminal of the first capacitor, a second terminal of the second capacitor is coupled to a second terminal of the first capacitor, a conductive component of the redistribution layer structure is applied as an electrode plate of the second capacitor,
- wherein in a vertical projection of the redistribution layer structure, the conductive component serving as the electrode plate of the second capacitor completely overlaps the first capacitor.

9. The integrated passive device with capacitors according to claim 8, further comprising:
- an inductance, electrically connected to the first capacitor and the second capacitor.

10. An electrostatic discharge protection apparatus, comprising:
- a first transistor, wherein a first terminal and a second terminal of the first transistor are respectively coupled to a first power rail and a second power rail, wherein the first terminal and the second terminal of the first transistor are respectively connected to a first contact and a second contact disposed in the same metal layer of a redistribution layer structure;
- an impedance, wherein a first terminal of the impedance is coupled to the first power rail, a second terminal of the impedance is coupled to a control terminal of the first transistor;
- a capacitor, wherein a first terminal of the capacitor is coupled to a second terminal of the impedance, a second terminal of the capacitor is coupled to the second power rail; and
- a second transistor, wherein a control terminal of the second transistor is coupled to the second terminal of the impedance and the first terminal of the capacitor, a first terminal of the second transistor is coupled to a signal pin of a package, a second terminal of the second transistor is coupled to the first power rail or the second power rail.

11. The electrostatic discharge protection apparatus according to claim 10, wherein when the first power rail is a system voltage rail, the second power rail is a reference voltage rail, and when the first power rail is the reference voltage rail, the second power rail is the system voltage rail.

12. The electrostatic discharge protection apparatus according to claim 10, wherein the first transistor is a thin film transistor, a semiconductor material of the thin film transistor comprises polysilicon, metallic oxide, or microcrystalline silicon.

13. The electrostatic discharge protection apparatus according to claim 10, wherein the first transistor is a P-type low-temperature polysilicon thin film transistor.

14. The electrostatic discharge protection apparatus according to claim 10, further comprising:
- a third transistor, wherein a control terminal of the third transistor is coupled to the second terminal of the impedance and the first terminal of the capacitor, a first terminal of the third transistor is coupled to the signal pin of the package,
- wherein when the second terminal of the second transistor is coupled to the first power rail, a second terminal of the third transistor is coupled to the second power rail, and when the second terminal of the second transistor is coupled to the second power rail, the second terminal of the third transistor is coupled to the first power rail.

* * * * *